United States Patent
Bolatkale

(10) Patent No.: US 11,876,524 B2
(45) Date of Patent: Jan. 16, 2024

(54) HYBRID ADC CIRCUIT AND METHOD

(71) Applicant: NXP B.V., Eindhoven (NL)

(72) Inventor: Muhammed Bolatkale, Delft (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/809,315

(22) Filed: Jun. 28, 2022

(65) Prior Publication Data

US 2023/0017344 A1   Jan. 19, 2023

(30) Foreign Application Priority Data

Jul. 16, 2021 (EP) ..................... 21186151

(51) Int. Cl.
| | |
|---|---|
| *H03M 1/10* | (2006.01) |
| *H03M 1/00* | (2006.01) |
| *H03M 1/06* | (2006.01) |
| H03M 3/00 | (2006.01) |
| H03M 1/12 | (2006.01) |

(52) U.S. Cl.
CPC ......... *H03M 1/001* (2013.01); *H03M 1/0629* (2013.01); *H03M 1/00* (2013.01); *H03M 1/12* (2013.01); *H03M 3/00* (2013.01)

(58) Field of Classification Search
CPC ...... H03M 1/001; H03M 1/0629; H03M 1/12; H03M 1/00; H03M 3/00
See application file for complete search history.

(56) References Cited

U.S. PATENT DOCUMENTS

| | | |
|---|---|---|
| 9,614,510 B2 | 4/2017 | Srinivasan et al. |
| 10,171,102 B1 | 1/2019 | Shibata et al. |
| 10,181,860 B1 | 1/2019 | Patil et al. |
| 10,187,075 B1 | 1/2019 | Patil et al. |
| (Continued) | | |

OTHER PUBLICATIONS

Cenci, P., "A 3.2mW SAR-assisted CtΔΣ ADC with 77.5dB SNDR and 40MHz BW in 28nm CMOS," 2019 Symposium on VLSI Circuits, Kyoto, Japan, pp. C230-C231, Jun. 9-14, 2019.

(Continued)

*Primary Examiner* — Joseph J Lauture

(57) ABSTRACT

There is described a hybrid ADC device for converting an analog input signal (Vin) into a digital output signal (Vout), the device comprising a first ADC circuit configured to receive the analog input signal (Vin) and convert it into a first digital signal (Y0); a DAC circuit configured to receive the first digital signal and convert it into a first analog signal; a delay circuit configured to delay the analog input signal; a first combiner configured to generate an analog residual signal by subtracting the first analog signal from the delayed analog input signal; a second ADC circuit configured to receive the residual analog signal and convert it into a second digital signal (Y1); a filter circuit configured to receive the first digital signal and output a filtered first digital signal (Y0'), the filter circuit having a transfer function corresponding to a combined transfer function of the DAC circuit and the second ADC circuit; and a second combiner configured to generate the digital output signal (Vout) by adding the second digital signal and the filtered first digital signal, wherein the first ADC circuit comprises an anti-aliasing filter. Furthermore, a corresponding method and an automobile radar system are described.

20 Claims, 4 Drawing Sheets

(56) References Cited

U.S. PATENT DOCUMENTS

| | | |
|---|---|---|
| 10,361,711 B1 | 7/2019 | Yendluri et al. |
| 10,432,210 B1 | 10/2019 | Yendluri et al. |
| 11,005,491 B1* | 5/2021 | Hu ............... H04L 27/2614 |
| 2009/0325632 A1* | 12/2009 | Gambini ............ H03M 3/37 |
| | | 341/143 |
| 2020/0373934 A1 | 11/2020 | Shibata et al. |

OTHER PUBLICATIONS

Shibata, H., "A 9-GS/s 1.125-GHz BW Oversampling Continuous-Time Pipeline ADC Achieving-164-dBFS/Hz NSD," in IEEE Journal of Solid-State Circuits, vol. 52, No. 12, pp. 3219-3234, Dec. 2017.

* cited by examiner

HYBRID ADC CIRCUIT AND METHOD

CROSS-REFERENCE TO RELATED APPLICATIONS

This application claims the priority under 35 U.S.C. § 119 of European Patent application no. 21186151.3, filed on 16 Jul. 2021, the contents of which are incorporated by reference herein.

TECHNICAL FIELD

The present disclosure relates to the field of analog to digital converter (ADC) circuits and methods. More specifically, the present disclosure relates to a hybrid ADC circuit for converting an analog input signal into a digital output signal method, and to an automobile radar system comprising such hybrid ADC circuit. Furthermore, the present disclosure relates to a method of converting an analog input signal into a digital output signal.

ART BACKGROUND

Hybrid ADC circuits, such as successive approximation register (SAR) assisted continuous-time delta-sigma (CTΔΣ) analog-to-digital converter (ADC) circuits, have many applications, including car radar products for preventing collisions. However, with increasing requirements for input signal bandwidth beyond 100 MHz, aliasing effects make it difficult to achieve the required power efficiency while effectively utilizing the available supply headroom.

There may thus be a need for circuits and methods capable of overcoming these drawbacks.

SUMMARY

This need may be met by the subject matter according to the independent claims. Advantageous embodiments of the present disclosure are set forth in the dependent claims.

According to a first aspect, there is provided a hybrid ADC device for converting an analog input signal into a digital output signal. The device comprises a first ADC circuit configured to receive the analog input signal and convert it into a first digital signal; a DAC circuit configured to receive the first digital signal and convert it into a first analog signal; a delay circuit configured to delay the analog input signal; a first combiner configured to generate an analog residual signal by subtracting the first analog signal from the delayed analog input signal; a second ADC circuit configured to receive the residual analog signal and convert it into a second digital signal; a filter circuit configured to receive the first digital signal and output a filtered first digital signal, the filter circuit having a transfer function corresponding to a combined transfer function of the DAC circuit and the second ADC circuit; and a second combiner configured to generate the digital output signal by adding the second digital signal and the filtered first digital signal, wherein the first ADC circuit comprises an anti-aliasing filter.

This aspect is based on the idea that an anti-aliasing filter is embedded into the first ADC circuit of the hybrid ADC device in order to prevent or at least reduce or attenuate aliasing signals (also referred to as "blockers") within the input signal bandwidth. Thereby, corresponding increases in amplitude of the analog residual signal are correspondingly prevented (or at least reduced or attenuated).

According to an embodiment, the anti-aliasing filter comprises a passive low-pass filter arranged to filter the analog input signal prior to converting the analog input signal into the first digital signal.

The passive low-pass filter is easy and cheap to implement and provides an effective reduction of the undesirable aliasing effects that occur in prior art circuits.

According to a further embodiment, the first ADC circuit comprises a CT Sigma-Delta ADC with passive loop filter.

In this embodiment, the anti-aliasing filter is implemented as an integral part (i.e., as the loop filter) of a CT (Continuous-Time) Sigma-Delta ADC. The CT Sigma-Delta ADC may be a first order, second order, third order, or even higher order Delta-Sigma modulator. In case of higher order (i.e., above first order) Delta-Sigma modulators, the loop filter may be implemented as a cascade of first order filters.

According to a further embodiment, the passive loop filter comprises an RC filter circuit.

In other words, the passive loop filter comprises a simple analog low-pass filter.

According to a further embodiment, the delay circuit comprises an all-pass filter.

The delay circuit serves to assure that the analog input signal is delayed by an amount corresponding to the delay induced by the first ADC circuit and the DAC circuit. Thereby, the first analog signal and the delayed analog input signal are in phase at the first combiner.

According to a further embodiment, the second ADC circuit comprises a low-pass filter, an amplifier, and a CT Delta-Sigma ADC circuit.

In other words, the second ADC circuit is configured to filter the analog residual signal and amplify the filtered analog residual signal as appropriate before converting it into the second digital signal.

According to a second aspect, there is provided a method of converting an analog input signal into a digital output signal. The method comprises receiving the analog input signal at a first ADC circuit and converting it into a first digital signal; receiving the first digital signal at a DAC circuit and converting it into a first analog signal; delaying the analog input signal utilizing a delay circuit; generating an analog residual signal by subtracting the first analog signal from the delayed analog input signal in a first combiner; receiving the residual analog signal at a second ADC circuit and converting it into a second digital signal; receiving the first digital signal at a filter circuit and outputting a filtered first digital signal, the filter circuit having a transfer function corresponding to a combined transfer function of the DAC circuit and the second ADC circuit; and generating the digital output signal by adding the second digital signal and the filtered first digital signal in a second combiner, wherein the first ADC circuit comprises an anti-aliasing filter.

This aspect is essentially based on the same idea as the first aspect discussed above and provides the same and similar advantages in terms of a method.

According to a further embodiment, the anti-aliasing filter comprises a passive low-pass filter arranged to filter the analog input signal prior to converting the analog input signal into the first digital signal.

The passive low-pass filter is easy and cheap to implement and provides an effective reduction of the undesirable aliasing effects that occur in prior art circuits.

According to a further embodiment, the first ADC circuit comprises a CT Sigma-Delta ADC with passive loop filter.

In this embodiment, the anti-aliasing filter is implemented as an integral part (i.e., as the loop filter) of a CT (Continuous-Time) Sigma-Delta ADC. The CT Sigma-Delta ADC may be a first order, second order, third order, or even higher order Delta-Sigma modulator. In case of higher order (i.e., above first order) Delta-Sigma modulators, the loop filter may be implemented as a cascade of first order filters.

According to a further embodiment, the passive loop filter comprises an RC filter circuit.

In other words, the passive loop filter comprises a simple analog low-pass filter.

According to a further embodiment, the delay circuit comprises an all-pass filter.

The delay circuit serves to assure that the analog input signal is delayed by an amount corresponding to the delay induced by the first ADC circuit and the DAC circuit. Thereby, the first analog signal and the delayed analog input signal are in phase at the first combiner.

According to a further embodiment, the second ADC circuit comprises a low-pass filter, an amplifier, and a CT Delta-Sigma ADC circuit.

In other words, the second ADC circuit is configured to filter the analog residual signal and amplify the filtered analog residual signal as appropriate before converting it into the second digital signal.

According to a third aspect, there is provided an automobile radar system comprising the hybrid ADC device according to the first aspect or any of the above embodiments thereof.

It should be noted that exemplary embodiments have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular a combination of features of the method type claims and features of the apparatus type claims, is also disclosed with this document.

The aspects defined above and further aspects of the present disclosure will be apparent from the examples of embodiment to be described hereinafter and are explained with reference to the examples of embodiment. Aspects of the present disclosure will be described in more detail hereinafter with reference to examples of embodiment to which the present disclosure is, however, not limited.

DETAILED DESCRIPTION

Figure 1:
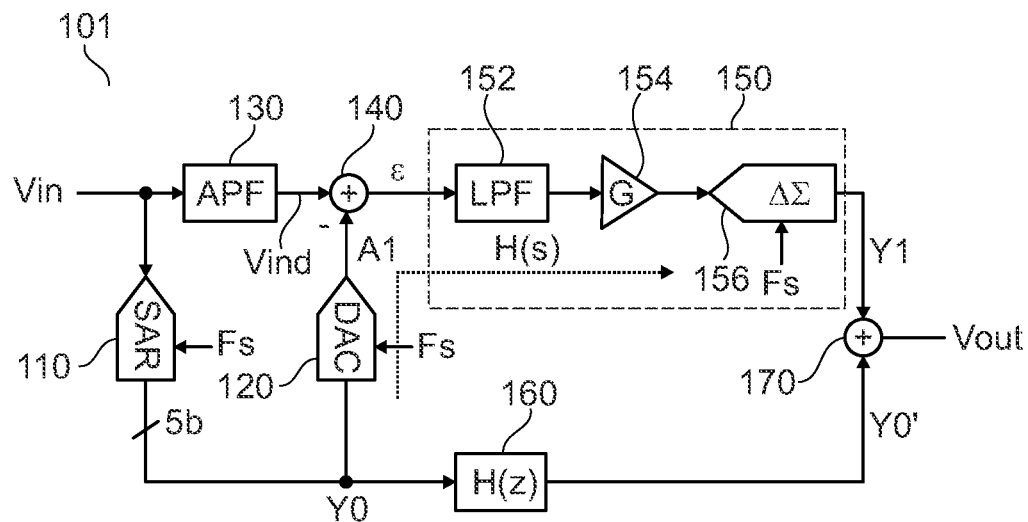
FIG. 1 shows a block diagram of a hybrid ADC device according to the prior art.

The illustration in the drawing is schematic. It is noted that in different figures, similar or identical elements are provided with the same reference signs or with reference signs, which differ only within the first digit.

FIG. 1 shows a block diagram of a hybrid ADC device 101 according to the prior art. The device 101 comprises a 5b-SAR ADC 110 forming a first ADC circuit configured to receive the analog input signal Vin and convert it into a first digital signal Y0. The device 101 further comprises a 5b-DAC circuit 120 configured to receive the first digital signal Y0 and convert it into a first analog signal A1. The device 101 further comprises an all-pass filter 130 forming delay circuit configured to delay the analog input signal Vin, thereby providing a delayed analog input signal Vind. A first combiner 140 is arranged and configured to generate an analog residual signal ε by subtracting the first analog signal A1 from the delayed analog input signal Vind. The residual signal ε corresponds to quantization noise, non-linearity and sampling images formed in the first ADC circuit 110. The device 101 further comprises a second ADC circuit 150 configured to receive the residual analog signal ε and convert it into a second digital signal Y1. The second ADC circuit comprises a low-pass filter 152 for filtering the residual analog signal ε, an amplifier 154 for amplifying the filtered residual analog signal ε, and a CTΔΣ ADC 156 for digitizing the amplified residual analog signal ε, thereby forming the second digital signal Y1. Furthermore, a filter circuit 160 is arranged and configured to receive the first digital signal Y0 and to output a filtered first digital signal Y0', the filter circuit having a transfer function H(z) corresponding to a combined transfer function H(s) of the DAC circuit 120 and the second ADC circuit 150. Finally, the device 101 comprises a second combiner 170 arranged and configured to generate the digital output signal Vout by adding the second digital signal Y1 and the filtered first digital signal Y0', such that the unwanted signal content corresponding to the residual signal ε is cancelled out. The first ADC circuit 110, the DAC circuit 120, and the second ADC circuit 150 all have the same sampling frequency Fs. However, it should be noted that in other implementations the first ADC circuit 110, the DAC circuit 120, and the second ADC circuit 150 may have different sampling frequencies. In one alternative example, the first ADC circuit 110 and/or the second ADC circuit 150 may run at half the sampling frequency of the DAC circuit 120. This would allow to save some power at the cost of a more complex implementation of the all-pass filter 130. In another alternative, the first ADC circuit 110 and/or the second ADC circuit 150 may run at higher sampling frequencies than the DAC circuit 120. Thereby, the latency of the first ADC circuit 110 and/or the second ADC circuit 150 is reduced, and as a result thereof, the implementation of the all-pass filer 130 may be less complex.

A major disadvantage of the architecture depicted in FIG. 1 is that the SAR ADC 110 aliases blockers located around Fs−Fbw (where Fbw denotes the desired bandwidth) into the input signal bandwidth which in return increases the amplitude of the residue signals F present at the input of the LPF 152. Since the LPF 152, amplifier 154 and CTΔΣ ADC 156 do not filter the in-band signals, the back end of the ADC must be able to have enough dynamic range to process such aliased blockers.

Figure 2:
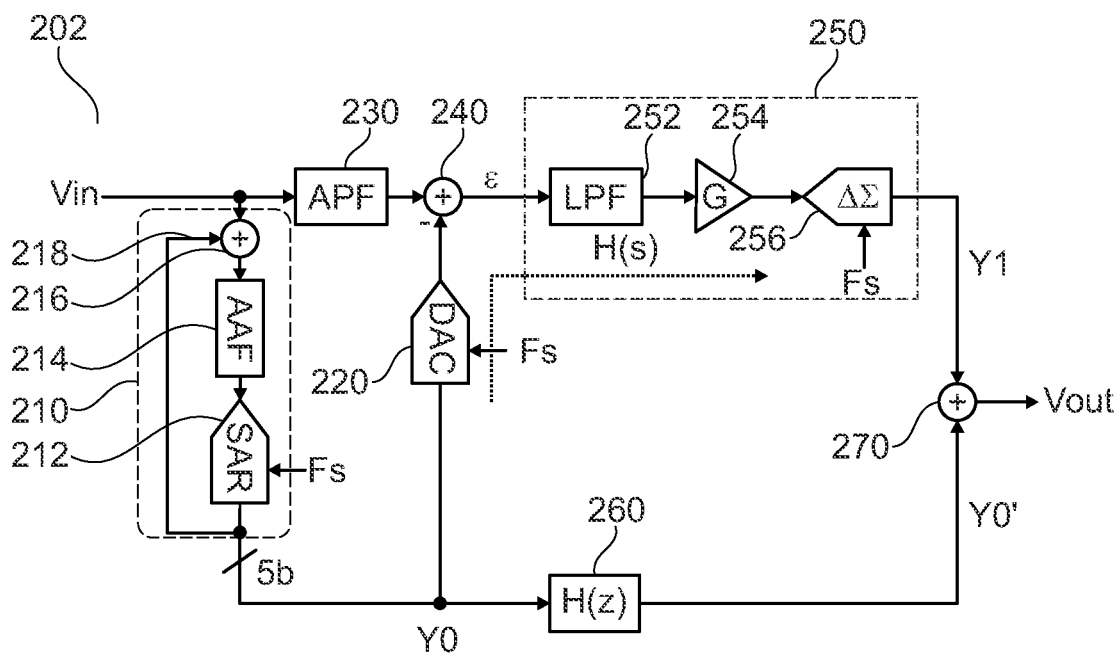
FIG. 2 shows a block diagram of a hybrid ADC device according to an exemplary embodiment.

To overcome this and other drawbacks, the present disclosure provides an improved hybrid ADC device 202 as shown in FIG. 2. More specifically, in the embodiment shown in FIG. 2, the first ADC circuit 210 comprises an anti-aliasing filter 214 in front of the SAR-based quantizer 212, and a feedback loop 218 coupled to a combiner 216 in front of the anti-aliasing filter 214. In other words, compared to the prior art circuit 101 shown in FIG. 1 and discussed above, the circuit 202 comprises a first ADC circuit 210 with an embedded anti-aliasing filter 214 implemented as a loop filter, preferably a passive low-pass filter. Otherwise, the circuit 202 is similar to circuit 101 shown in FIG. 1 and the corresponding description of the further elements and functions is not repeated here. As a result, summing the filtered first digital signal Y0' and the second digital signal Y1 at the combiner 270 results in cancellation of both aliasing components as well as SAR ADC related errors.

Figure 3:
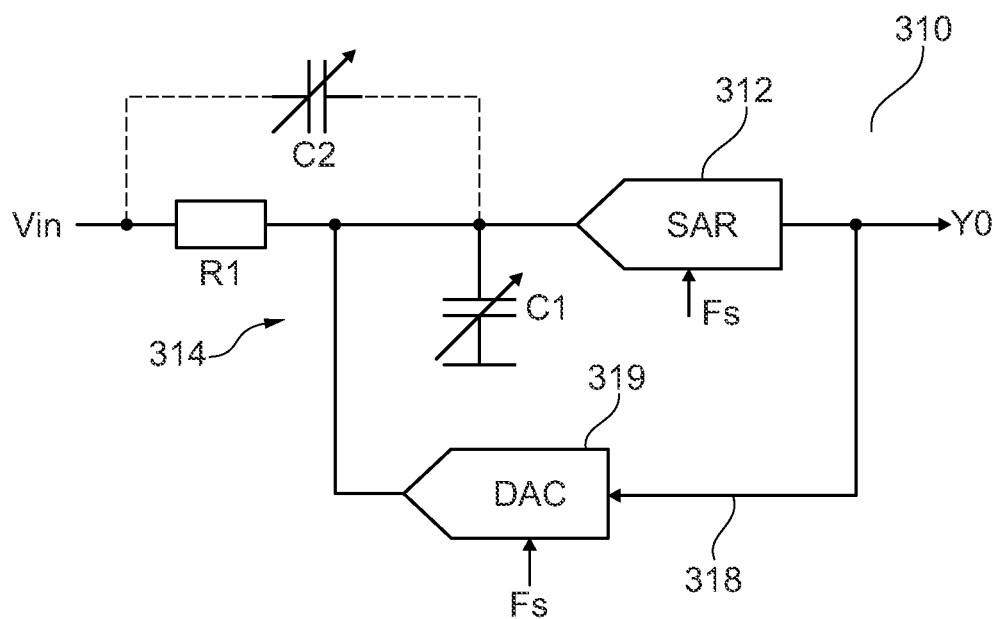
FIG. 3 shows a circuit diagram of a first ADC circuit comprising a passive loop filter according to an exemplary embodiment.

FIG. 3 shows a circuit diagram of a first ADC circuit 310 comprising a passive loop filter 314 according to an exemplary embodiment. The circuit 310 may in particular be used as the first ADC circuit 210 in the embodiment shown in FIG. 2. In this exemplary embodiment, the loop filter 314 is a first order passive low-pass filter comprising resistor R1, capacitor C1, and, optionally, capacitor C2. The feedback loop 318 comprises a DAC 319. The ADC circuit 310 is shown as a first order passive delta-sigma modulator. However, the skilled person will realize that the idea is also applicable for higher order delta-sigma modulators, where the loop may be implemented as a cascade of passive low-pass filters. Furthermore, stabilization networks, such as feed-forward coefficients, can also be implemented with passive components.

Figure 4:
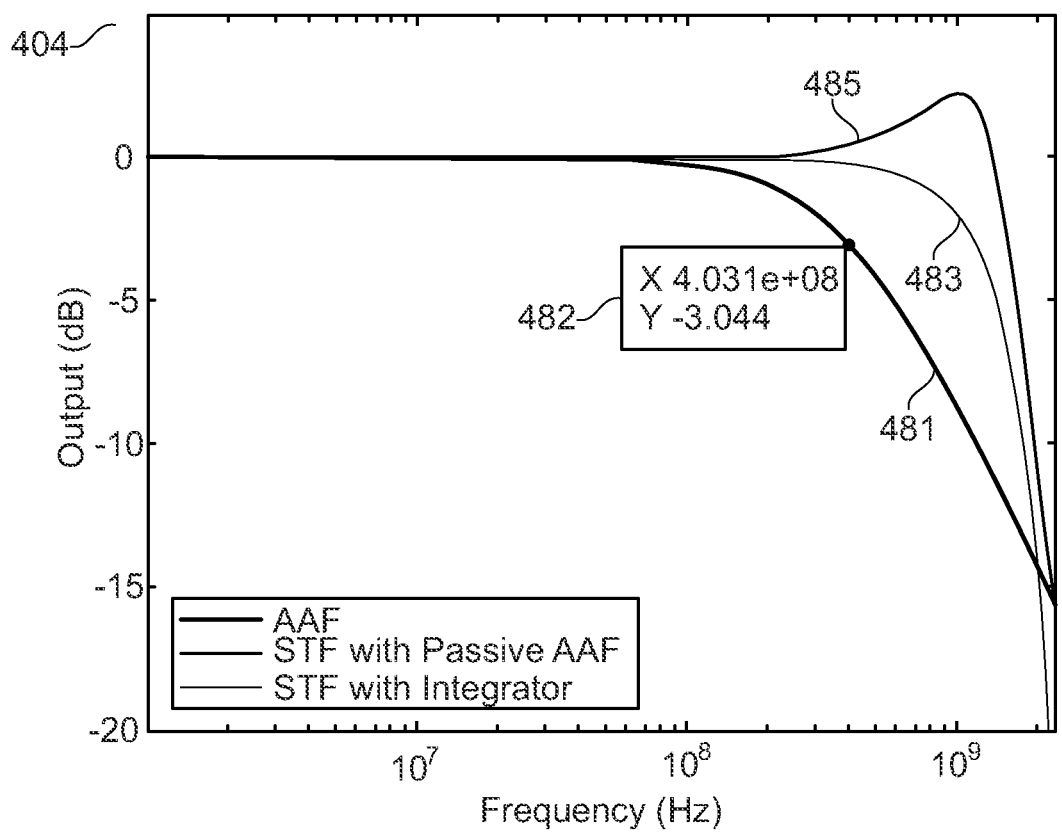
FIG. 4 shows transfer functions for three different filter configurations.
Figure 5:
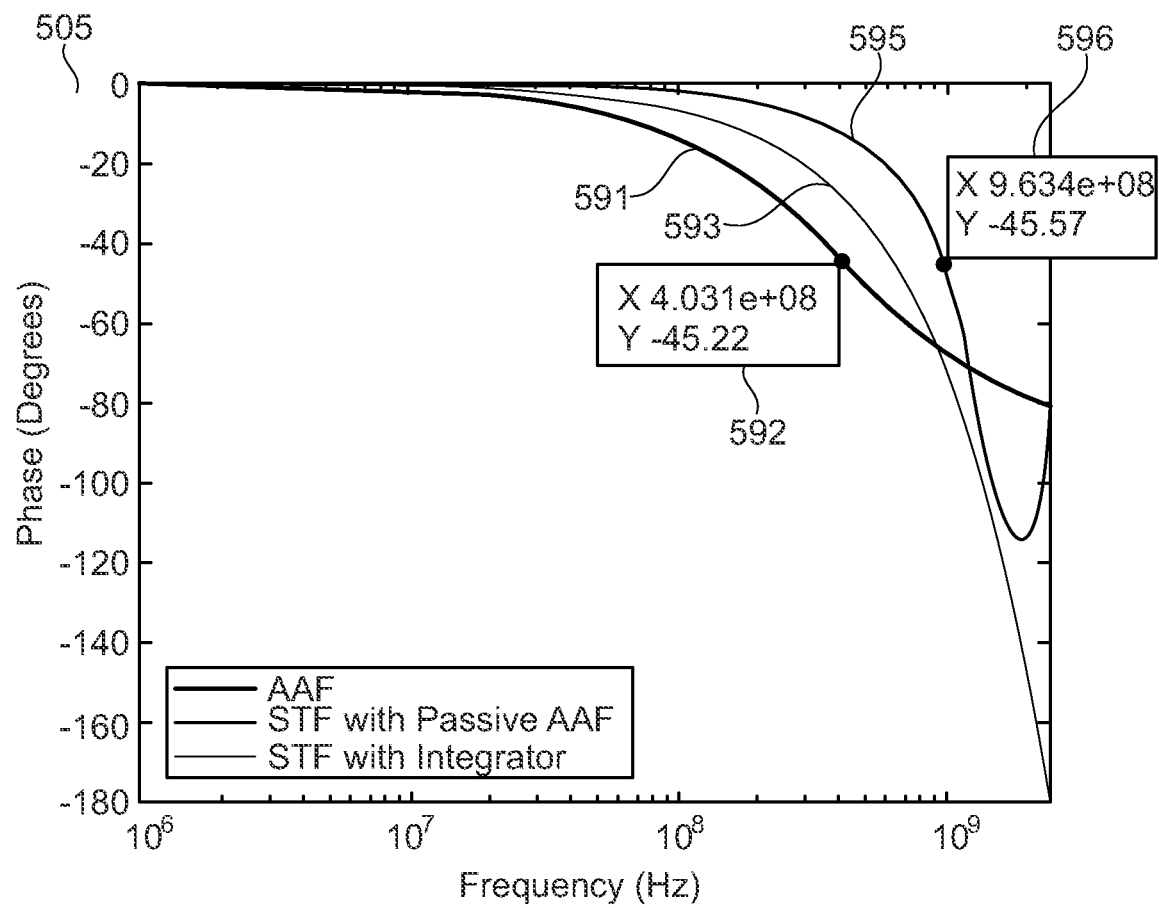
FIG. 5 shows phase responses for three different filter configurations.

FIG. 4 shows a plot 404 of transfer functions 481, 483, 485 for three different filter configurations. FIG. 5 shows a plot of corresponding phase responses 591, 593, 595 for the three different filter configurations. More specifically, the transfer function 481 shows the transfer function (STF) of a configuration where a first order anti-aliasing filter with a cut-off frequency of 400 MHz (cf. point 482 in FIG. 4) is arranged in front of the prior art device 101 shown in FIG. 1. Such a configuration has been proposed in the prior art, e.g. in U.S. Pat. No. 10,361,711 B1 and U.S. Pat. No. 10,187,075 B1. The corresponding phase response 591 is shown in FIG. 5 and it appears from point 592 that the first order filter introduces −45° of phase shift at 400 MHz. In comparison, the device 202 shown in FIG. 2 is represented by the curves 485 and 595. Here, the in-band attenuation of the filter is not present anymore and a phase shift of −45° does not occur until 950 MHz (cf. point 596 in FIG. 5). This indicates that the proposed architecture achieves much wider bandwidth and similar AAF response, see in particular FIG. 4 around 400 MHz (Fs−Fbw, where Fs=2.4 GHz). For further comparison, the curves 483 and 593 respectively show transfer function and phase response for an implementation with an integrator, as suggested e.g., in U.S. Pat. No. 9,614,510. As can be seen, the curves 483 and 593 extend mainly in-between the curves 481, 485 and 591, 595. Furthermore, the corresponding implementation is far more complex in comparison to the embedded passive loop filter suggested herein.

Figure 6:
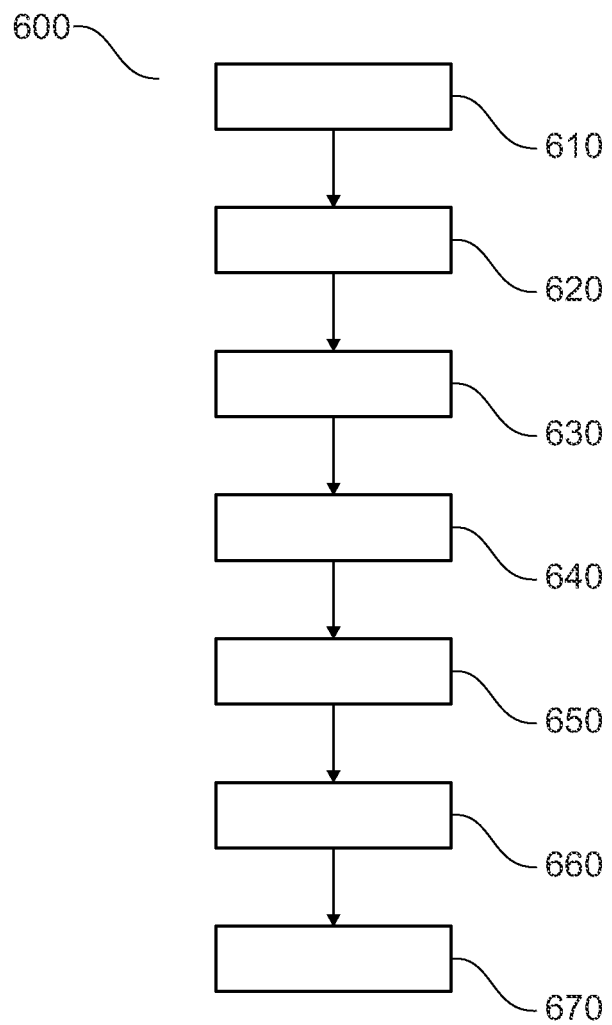
FIG. 6 shows a flow chart of a method of converting an analog input signal into a digital output signal according to an exemplary embodiment.

FIG. 6 shows a flow chart 600 of a method of converting an analog input signal into a digital output signal according to an exemplary embodiment. The method 600 begins at 610 by receiving the analog input signal Vin at a first ADC circuit 210 and converting it into a first digital signal Y0. The first ADC circuit 210 comprises an anti-aliasing filter 214, 314. At 620, the first digital signal Y0 is received at a DAC circuit 220 and converted into a first analog signal A1. Furthermore, at 630, the analog input signal Vin is delayed utilizing a delay circuit 230. The method continues at 640 by generating an analog residual signal ε by subtracting the first analog signal A1 from the delayed analog input signal in a first combiner 240. At 650, the residual analog signal ε is received at a second ADC circuit 250 and converted into a second digital signal Y1. Furthermore, at 660, the first digital signal Y0 is received at a filter circuit 260 and a filtered first digital signal Y0' is output. The filter circuit 260 has a transfer function H(z) corresponding to a combined transfer function H(s) of the DAC circuit 220 and the second ADC circuit 250. Then, at 670, the digital output signal Vout is generated by adding the second digital signal Y1 and the filtered first digital signal Y0' in a second combiner 270.

The proposed hybrid ADC circuit 202 is particularly useful in an automobile radar system for collision prevention as it provides a significant increase in useful bandwidth without adding significant complexity, cost, or footprint in comparison to existing systems.

It is noted that, unless otherwise indicated, the use of terms such as "upper", "lower", "left", and "right" refers solely to the orientation of the corresponding drawing.

It is noted that the term "comprising" does not exclude other elements or steps and that the use of the articles "a" or "an" does not exclude a plurality. Also, elements described in association with different embodiments may be combined. It should also be noted that reference signs in the claims should not be construed as limiting the scope of the claims.

What is claimed is:

1. A hybrid ADC device for converting an analog input signal into a digital output signal, the device comprising:
    a first ADC circuit configured to receive the analog input signal and convert it into a first digital signal, the first ADC circuit comprising:
        an SAR-based quantizer having an output for outputting the first digital signal,
        an anti-aliasing filter having an output coupled to an input of the SAR-based quantizer, and
        a feedback loop combiner having a first input coupled to receive the analog input signal, a second input coupled to the output of the SAR-based quantizer, and an output coupled to an input of the anti-aliasing filter;
    a DAC circuit configured to receive the first digital signal and convert it into a first analog signal;
    a delay circuit configured to delay the analog input signal;
    a first combiner configured to generate an analog residual signal by subtracting the first analog signal from the delayed analog input signal;
    a second ADC circuit configured to receive the residual analog signal and convert it into a second digital signal;
    a filter circuit configured to receive the first digital signal and output a filtered first digital signal, the filter circuit having a transfer function corresponding to a combined transfer function of the DAC circuit and the second ADC circuit; and
    a second combiner configured to generate the digital output signal by adding the second digital signal and the filtered first digital signal.

2. The device according to claim 1, wherein the anti-aliasing filter comprises a passive low-pass filter arranged to filter the analog input signal prior to converting the analog input signal into the first digital signal.

3. The device according to claim 1, wherein the first ADC circuit comprises a CT Sigma-Delta ADC with passive loop filter.

4. The device according to claim 3, wherein the passive loop filter comprises an RC filter circuit.

5. The device according to claim 1, wherein the delay circuit comprises an all-pass filter.

6. The device according to claim 1, wherein the second ADC circuit comprises a low-pass filter, an amplifier, and a CT Delta-Sigma ADC circuit.

7. A method of converting an analog input signal into a digital output signal, the method comprising:
receiving the analog input signal at a first ADC circuit and converting it into a first digital signal, the first ADC circuit comprising:
an SAR-based quantizer having an output for outputting the first digital signal,
an anti-aliasing filter having an output coupled to an input of the SAR-based quantizer, and
a feedback loop combiner having a first input coupled to receive the analog input signal,
a second input coupled to the output of the SAR-based quantizer, and an output coupled to an input of the anti-aliasing filter;
receiving the first digital signal at a DAC circuit and converting it into a first analog signal;
delaying the analog input signal utilizing a delay circuit;
generating an analog residual signal by subtracting the first analog signal from the delayed analog input signal in a first combiner;
receiving the residual analog signal at a second ADC circuit and converting it into a second digital signal;
receiving the first digital signal at a filter circuit and outputting a filtered first digital signal, the filter circuit having a transfer function corresponding to a combined transfer function of the DAC circuit and the second ADC circuit; and
generating the digital output signal by adding the second digital signal and the filtered first digital signal in a second combiner.

8. The method according to claim 7, wherein the anti-aliasing filter comprises a passive low-pass filter arranged to filter the analog input signal prior to converting the analog input signal into the first digital signal.

9. The method according to claim 7, wherein the first ADC circuit comprises a CT Sigma-Delta ADC with passive loop filter.

10. The method according to claim 9, wherein the passive loop filter comprises an RC filter circuit.

11. The method according to claim 7, wherein the delay circuit comprises an all-pass filter.

12. The method according to claim 7, wherein the second ADC circuit comprises a low-pass filter, an amplifier, and a CT Delta-Sigma ADC circuit.

13. An automobile radar system comprising a hybrid ADC device for converting an analog input signal into a digital output signal, the device comprising:
a first ADC circuit configured to receive the analog input signal and convert it into a first digital signal, the first ADC circuit comprising:
an SAR-based quantizer having an output for outputting the first digital signal,
an anti-aliasing filter having an output coupled to an input of the SAR-based quantizer, and
a feedback loop combiner having a first input coupled to receive the analog input signal, a second input coupled to the output of the SAR-based quantizer, and an output coupled to an input of the anti-aliasing filter;
a DAC circuit configured to receive the first digital signal and convert it into a first analog signal;
a delay circuit configured to delay the analog input signal;
a first combiner configured to generate an analog residual signal by subtracting the first analog signal from the delayed analog input signal;
a second ADC circuit configured to receive the residual analog signal and convert it into a second digital signal;
a filter circuit configured to receive the first digital signal and output a filtered first digital signal, the filter circuit having a transfer function corresponding to a combined transfer function of the DAC circuit and the second ADC circuit; and
a second combiner configured to generate the digital output signal by adding the second digital signal and the filtered first digital signal.

14. The device according to claim 13, wherein the anti-aliasing filter comprises a passive low-pass filter arranged to filter the analog input signal prior to converting the analog input signal into the first digital signal.

15. The device according to claim 13, wherein the first ADC circuit comprises a CT Sigma-Delta ADC with passive loop filter.

16. The device according to claim 15, wherein the passive loop filter comprises an RC filter circuit.

17. The device according to claim 13, wherein the delay circuit comprises an all-pass filter.

18. The device according to claim 13, wherein the second ADC circuit comprises a low-pass filter, an amplifier, and a CT Delta-Sigma ADC circuit.

19. The device according to claim 13, wherein the DAC circuit and the first ADC circuit are configured for sampling at a same frequency.

20. The device according to claim 13, wherein the first ADC circuit and the second ADC circuit are configured for sampling at a same frequency.

* * * * *